US010680166B2

(12) United States Patent
Yu et al.

(10) Patent No.: US 10,680,166 B2
(45) Date of Patent: *Jun. 9, 2020

(54) SEMICONDUCTOR STRUCTURE AND ASSOCIATED OPERATING AND FABRICATING METHOD

(71) Applicant: TAIWAN SEMICONDUCTOR MANUFACTURING COMPANY LTD., Hsinchu (TW)

(72) Inventors: Chwen Yu, Taipei (TW); Shy-Jay Lin, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/386,715

(22) Filed: Apr. 17, 2019

(65) Prior Publication Data

US 2019/0245140 A1    Aug. 8, 2019

Related U.S. Application Data

(63) Continuation of application No. 15/798,220, filed on Oct. 30, 2017, now Pat. No. 10,276,784.

(51) Int. Cl.
*G11C 5/02* (2006.01)
*H01L 43/08* (2006.01)
*H01L 43/12* (2006.01)
*G11C 11/16* (2006.01)
*H01L 27/22* (2006.01)

(52) U.S. Cl.
CPC ............ *H01L 43/08* (2013.01); *G11C 11/161* (2013.01); *G11C 11/1675* (2013.01); *H01L 43/12* (2013.01); *H01L 27/222* (2013.01)

(58) Field of Classification Search
CPC ............ G11C 13/0069; G11C 11/1675; G11C 11/1673; G11C 13/004; G11C 11/161; G11C 13/0007; G11C 2213/79; G11C 11/1659; G11C 13/0002; G11C 13/0026; G11C 13/0023; G11C 11/16
USPC ....... 365/148, 158, 189.011, 189.09, 189.15, 365/191, 189.05, 189.07, 63, 154, 189.11, 365/189.12, 189.2, 203, 207
See application file for complete search history.

(56) References Cited

U.S. PATENT DOCUMENTS 10,276,784 B1 * 4/2019 Yu .......................... H01L 43/08

* cited by examiner

*Primary Examiner* — Thong Q Le
(74) *Attorney, Agent, or Firm* — WPAT, P.C., Intellectual Property Attorneys; Anthony King

(57) ABSTRACT

A semiconductor structure is provided. The semiconductor structure includes: a substrate; a magnetic layer over the substrate; a magnetic tunnel junction (MTJ) cell over the magnetic layer; and a non-magnetic conductive layer between the magnetic layer and the MTJ cell. An associated method for fabricating the semiconductor structure is also disclosed.

20 Claims, 12 Drawing Sheets

| | |
|---|---|
| 114 | Top Electrode |
| 112 | Reference Layer |
| 110 | Barrier Layer |
| 108 | Free Layer |
| 106 | Spacer Layer |
| 104 | Magnetic Layer |
| 113 | inter-metal dielectrics 118 |
| 111 | inter-layer dielectric |
| 101 | Semiconductor Substrate |

SEMICONDUCTOR STRUCTURE AND ASSOCIATED OPERATING AND FABRICATING METHOD

CROSS REFERENCE TO RELATED APPLICATIONS

This application is a continuation of application Ser. No. 15/798,220, filed on Oct. 30, 2017, which is incorporated by reference in its entirety.

BACKGROUND

Previous efforts at implementing electromagnetic components that utilize magnetoresistance phenomena to achieve two information states (i.e. one bit of information), e.g. magnetic tunnel junctions (MTJs), were largely directed at using a current to produce a magnetic field to manipulate the device, and/or directly torqueing the magnetic domains to manipulate the device. However, the currents required were often considerable, particularly in cases where MTJs were used in MRAM configurations. Indeed, in applications that require low-power operation, the requirement of a considerable current made the implementation of devices that rely on MTJs less commercially viable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 to FIG. 12 are cross-sectional views of a semiconductor device fabricated at various stages in accordance with various embodiments of the present disclosure.

DETAILED DESCRIPTION

Figure 1:
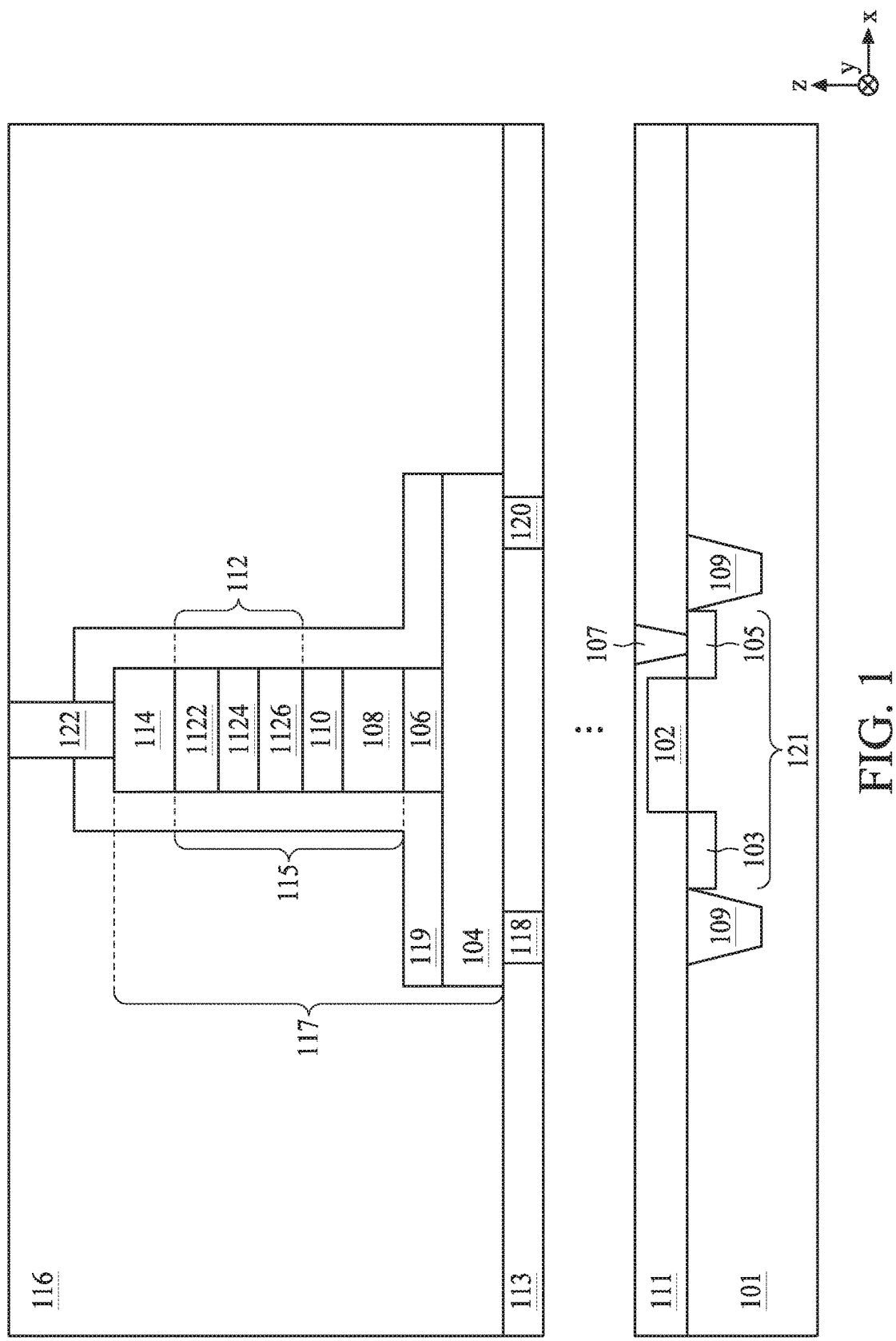
FIG. 1 is a cross-sectional view illustrating a semiconductor structure in accordance with various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a cross-sectional view illustrating a semiconductor structure 100 in accordance with various embodiments of the present disclosure. The semiconductor structure 100 includes a magnetoresistive random access memory (MRAM) device 117 formed over a semiconductor substrate 101. In the present embodiment, the semiconductor substrate 101 is a p-type semiconductor substrate (P-Substrate) or an n-type semiconductor substrate (N-Substrate) comprised of silicon. Alternatively, the semiconductor substrate 101 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In many instances, the semiconductor substrate 101 is a semiconductor on insulator (SOI). In other alternatives, the semiconductor substrate 101 may include a doped epi layer, a gradient semiconductor layer, and/or a semiconductor layer overlying another semiconductor layer of a different type, such as a silicon layer on a silicon germanium layer. In many instances, the semiconductor substrate 101 may include doped regions, such as a p-well, an n-well, or combination thereof.

The semiconductor substrate 101 further includes heavily doped regions such as a source 103 and a drain 105 at least partially in the semiconductor substrate 101. A gate 102 is positioned over a top surface of the semiconductor substrate 101 and between the source 103 and the drain 107 to jointly form a transistor structure 121. FIG. 1 shows planar transistors having a doped region in the semiconductor substrate 101. However, the present disclosure is not limited thereto. Any non-planar transistor, such as a FinFET structure, can have raised doped regions. Contact plugs 107 may be formed in inter-layer dielectric (ILD) 111 adjoined to the top surface of the semiconductor substrate 101, and may be electrically coupled to the transistor structure 121. The ILD 111 above the semiconductor substrate 101 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

In many instances, shallow trench isolation (STI) structures 109 are provided to define and electrically isolate adjacent transistors. The STI structures 109 are formed in the semiconductor substrate 101. The STI 109 may be formed by etching or otherwise forming a recess in the substrate 101 and subsequently filling the recess with silicon dioxide and/or another dielectric material, possibly followed by a chemical-mechanical-polishing (CMP) or other planarization steps.

In many instances, the MRAM device 117 is embedded in the metallization layer prepared in a back-end-of-line (BEOL) operation, whereas the transistor structure 121 is prepared in a front-end-of-line operation. The MRAM device 117 may be embedded in any position of the metallization layer over the transistor structure 121, for example, between adjacent metal layers distributed horizontally parallel to a surface of the semiconductor substrate 101. Throughout the description, the term "metal layer" refers to the collection of the metal lines in the same layer. For instance, the embedded MRAM device 117 can be located between the $4^{th}$ metal layer and the $5^{th}$ metal layer. The number provided for the metal layer herein is not limiting. In general, people having ordinary skill in the art can understand that the MRAM is located between an $N^{th}$ metal layer and an $(N+1)^{th}$ metal layer, where N is an integer greater than or equal to 1. Because the $N^{th}$ metal layer may not be the first metal layer over the transistor structure 121, the omission of a portion of the metallization structure is represented by dots in FIG. 1.

Referring to FIG. 1, the MRAM device 117 includes a first terminal 118, a second terminal 120 and a third terminal 122. For many instances, the first terminal 118 is configured to be a write terminal and coupled to a first end (e.g. the left end) of the magnetic layer 104; the second terminal 120 is configured to be a read/write terminal and coupled to a second end (e.g. the right end) opposite to the first side of the magnetic layer 104; and the third terminal 122 is configured to be a read terminal and coupled to the top electrode 114. The first terminal 118 and the second terminal 120 may be metal lines disposed in the $N^{th}$ metal layer. The third terminal 122 may be a metal line disposed in the $(N+1)^{th}$ metal layer. In some embodiments, the configuration of the first terminal 118 and the second terminal 120 may be interchangeable. For example, the first terminal 118 may be a read/write terminal and the second terminal 120 may be a write terminal. In many instances, the metal lines 118, 120 and 122 may be formed from W, and more preferably from copper (Cu), including AlCu (collectively, Cu). Metal layers $M_1$ through $M_N$ are formed in inter-metal dielectrics (IMDs) 113, which may include a low dielectric constant (k value) material or an extra low dielectric constant (ELK) material. Generally, a low-k dielectric material has a dielectric constant of less than about 3.5, and an ELK dielectric material has a dielectric constant of less than about 2.8. The ELK material includes, for instance, carbon-doped silicon dioxide and porous silicon dioxide.

The MRAM device 117 includes a top electrode 114, a magnetic tunnel junction (MTJ) cell 115, a spacer layer 106 and a magnetic layer 104. The top electrode 114 is electrically coupled to the MTJ cell 115 for signal/bias conveyance. In many instances, the top electrode 114 may include Ta, Ta/TaN, Ta/TiN, TiN, TaN, TaN/TiN or the like. The top electrode 114 may have a thickness of about 50 to 90 nm. Following the example previously provided, the top electrode is further connected to the $(N+1)^{th}$ metal layer through the $(N+1)^{th}$ metal line 122. On the other hand, the magnetic layer 104 is coupled to the $N^{th}$ metal layer through the $N^{th}$ metal lines 118 and 120. The magnetic layer 104 may include ferromagnetic material, which may be comprised of metal or metal alloy, for example, Fe, Co, Ni, NiFe, CoFeB, FeB, CoFe, FePt, FePd, CoPt, CoPd, CoNi, TbFeCo, CrNi or the like.

In some embodiments, sidewalls of the MTJ cell 115 may be protected by a protection or barrier layer 119. In many instances, the protection or barrier layer 119 may be formed around edges and sides of the MTJ device 117. For example, the protection or barrier layer 119 may as well encapsulate the spacer layer 106 and the magnetic layer 104. In many instances, the protection or barrier layer 119 further covers a top surface of the top electrode 114 and/or the magnetic layer 104. The protection or barrier layer 119 may include silicon nitride (SiN), $SiO_2$, $Al_2O_3$ or the like. In many instances, the protection or barrier layer 119 may have a thickness of about 15 to 35 nm. A dielectric layer 116 is further disposed over the IMDs 113 and surround the protection or barrier layer 119. In many instances, the dielectric layer 116 includes $SiO_2$, TEOS/SRO, SiC and the like.

The spacer layer 106 is formed between the MTJ cell 115 and the magnetic layer 104 to avoid the MTJ cell 115 from directly adjoining the magnetic layer 104. In particular, an upper side of the spacer layer 106 directly adjoins the MTJ cell 115 and a lower side of the spacer layer 106 directly adjoins the magnetic layer 104. The spacer layer 106 is comprised of non-magnetic conductive material, including metal, such as Ag, Au, Cu, Ta, W, Mn, Pt, Pd, V, Cr, Nb, Mo, Tc, Ru or the like. Notable, a thickness of the spacer layer 106 should be no greater than a spin diffusion length of the non-magnetic conductive material. In many instances, the spacer layer 106 may have a thickness of about 0.5 nm to about 3 nm.

The MTJ cell 115 is deposited in a form of multiple material stacks over the spacer layer 106. As shown in FIG. 1, the MTJ cell 107 includes a reference layer 112, a barrier layer 110 and a free layer 108. The barrier layer 110 is comprised of a non-magnetic material interposed between the reference layer 112 and the free layer 108. In some embodiments, the barrier layer 110 is an insulator, for example a tunneling barrier. In such embodiments, the barrier layer 110 may include a dielectric oxide such as magnesium oxide (MgO) having a thickness of approximately, but not limited to, 0.6 to 2 nm. Alternatively, the barrier layer 110 may include aluminum oxide (AlO), aluminum nitride (AlN), aluminum oxynitride (AlON), tantalum oxide (TaO), ruthenium oxide (RuO) or other suitable non-magnetic material. The barrier layer 110 may enhance the tunnel magnetoresistance phenomena (TMR) and spin transfer efficiency for the MTJ cell 115.

The free layer 108 and reference layer 112 may include ferromagnetic material, which may be comprised of metal or metal alloy, for example, Fe, Co, Ni, NiFe, CoFeB, FeB, CoFe, FePt, FePd, CoPt, CoPd, CoNi, TbFeCo, CrNi or the like. In some embodiments, the free layer 108 and/or the reference layer 112 may further include multiple layers. For example, as shown in FIG. 1, the reference layer 112 may include ferromagnetic layers 1122 and 1126 interleaved with a non-magnetic layer 1124. In such embodiments, the ferromagnetic layers 1122 and 1126 may be antiferromagnetically aligned. Thus, the reference layer 112 may be a synthetic antiferromagnet (SAF). The magnetic moments, i.e. the direction of magnetization, of the reference layer 112 and free layer 108 may be perpendicular to plane (i.e. "out-of-plane", e.g. along the z-axis as referenced by FIG. 1).

Certain components are described as being magnetic, ferromagnetic, or ferrimagnetic. As used herein, the term magnetic throughout the present disclosure could include ferromagnetic, ferrimagnetic or like structures. Thus, as used herein, the term "magnetic" or "ferromagnetic" includes, but is not limited to ferromagnets and ferrimagnets. Further, as used herein, "out-of-plane" corresponds to a direction that is substantially perpendicular to one or more of the layers of the MTJ device 117. Conversely, "in-plane" is substantially within or parallel to the plane of one or more of the layers of the MTJ device 117.

The magnetic moment of the reference layer 112 is desired to be substantially fixed, or pinned, in place during operation of the semiconductor structure 100. In contrast, the magnetization direction of the free layer 108 is free to rotate and is representative of a logical value written into the MTJ cell 115. Stated in other words, the magnetic moment of the free layer 108 is switchable through controlling the magnetic layer 104 as being detailed described below. Depending upon the orientations of the magnetic moments of the free layer 108 and the reference layer 112, the resistance of the MTJ cell 115 will change. Thus, the logical value may be read by determining the resistance of the MTJ cell 115. When the magnetization of the free layer 108 and the reference layer 112 are parallel and the magnetic moments have the same polarity, the resistance of the MTJ cell 115 is low. Typically, this is designated a logical value "0." When the magnetization of the free layer 108 and the reference layer 112 are antiparallel (i.e. the magnetic moments have the opposite polarity), the resistance of the MTJ cell 115 is high. Typically, this is designated a logical value "1."

Spin orbit transfer (SOT) (also known as spin hall effect) is one existing technique for writing to memory elements through spin-orbit interaction. Materials that exhibit spin Hall effect often include heavy metals or materials doped by heavy metals. Normally, a heavy metal layer resides adjacent to the free layer. The heavy metal layer is configured to exert a spin orbit torque on the free layer due to a current passing through the heavy metal layer in a direction substantially perpendicular to a direction between the heavy metal layer and the free layer. However, an efficiency of the spin orbit torque is not superior in particular when the direction of magnetization of the reference layer and free layer is perpendicular to plane. Since the efficiency of the spin orbit torque is proportional to the current passing through the heave metal layer, power consumption may increase when the write time is a first priority consideration.

The present disclosure jumps out the existing SOT technique and provides an alternative technique to switch the magnetic moment of the free layer 108 with the assist of the Bloch wall in the magnetic layer 104 disposed below the MTJ cell 115. A wall is a boundary between domains in which the magnetization is in different directions. There are at least two types of walls that occur in thin magnetic films. One is the Bloch wall and the other is the Neel wall. A field of the Bloch wall is able to affect the direction of magnetization of the free layer 108. In addition, a part of the current passing through the magnetic layer 104 may be spin polarized by the field of the Bloch wall and therefore passing through the free layer 108. Like spin torque transfer (STT), the electrons may get repolarized on account of the orientation of the magnetic moments of the free layer 108. The repolarizing of the electrons leads to the free layer 108 experiencing a torque associated with the change in the angular momentum of the electrons as they are repolarized. As a result, this torque also contributes to switching the direction of the magnetization of the free layer 108. The current required for moving the domain wall and thereby switching the free layer 108 is about 40 times less than the threshold current required for the existing SOT technique. So an improved power scheme is obtained without affect the write time.

The present disclosure is described in the context of current understanding of Bloch wall, STT, SOT, the spin transfer phenomenon, of magnetic anisotropy, and other physical phenomenon. Consequently, one of ordinary skill in the art will readily recognize that theoretical explanations of the behavior of the method and system are made based upon this current understanding of Bloch wall, STT, SOT, spin transfer, magnetic anisotropy and other physical phenomenon. However, the present disclosure described herein is not dependent upon a particular physical explanation.

Figure 2:
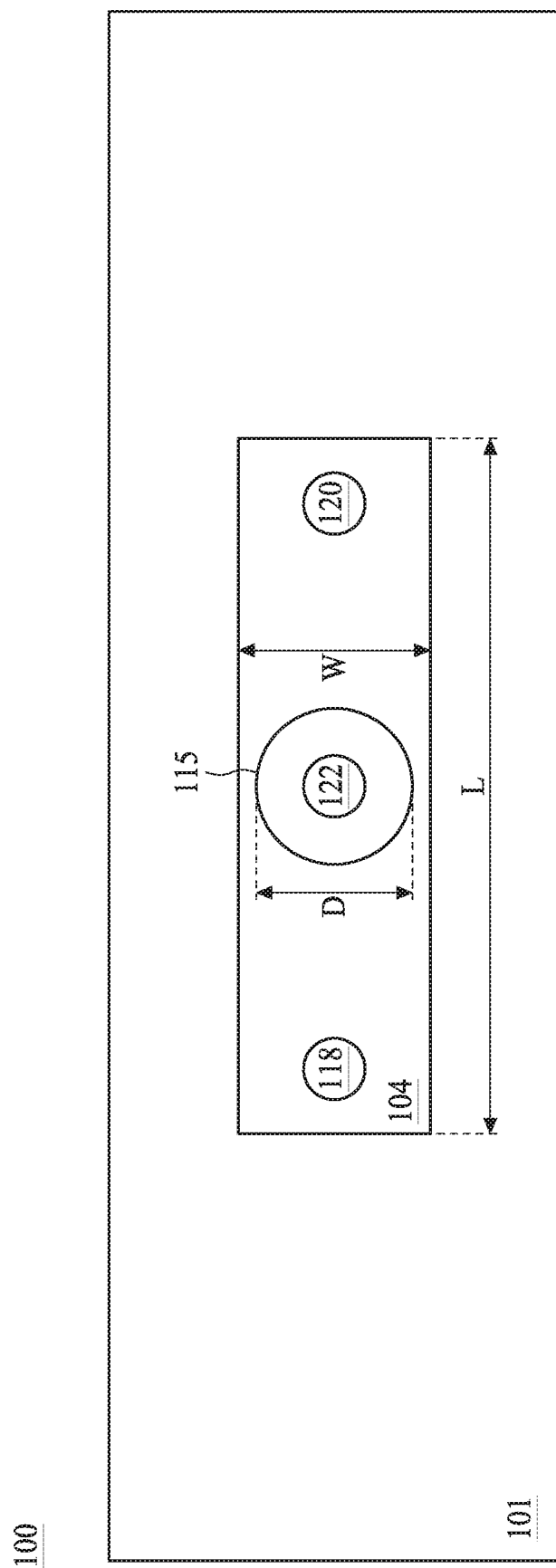
FIG. 2 is a top view illustrating the semiconductor structure in accordance with various embodiments of the present disclosure.

FIG. 2 is a top view illustrating the semiconductor structure 100 in accordance with various embodiments of the present disclosure. In particular, arrangement of the magnetic layer 104, the MTJ cell 115, the semiconductor substrate 101, the $N^{th}$ metal lines 118 and 120 and the $(N+1)^{th}$ metal line 122 are depicted. Other elements or layers of FIG. 1 may be omitted in FIG. 2 for conciseness. In many instances, the magnetic layer 104 is substantially elongated rectangular-shaped. The shape of the MTJ cell 115 can be selected based on desired magnetic polarization orientations. In the exemplary embodiment, it is desired that the magnetic anisotropy has a directional component that is "out-of-plane", therefore the shape of the MTJ cell 115 can be made to be symmetrical from the top view, e.g. circular. In this case, while the tendency of the magnetization to remain in-plane may still exist, it may not have a preferred directionality within the plane of the layer, and thus the layer may define an easy plane insofar as there is an anisotropic tendency within the plane of the layer although there is no preferred axis of magnetization within the plane.

Figure 3:
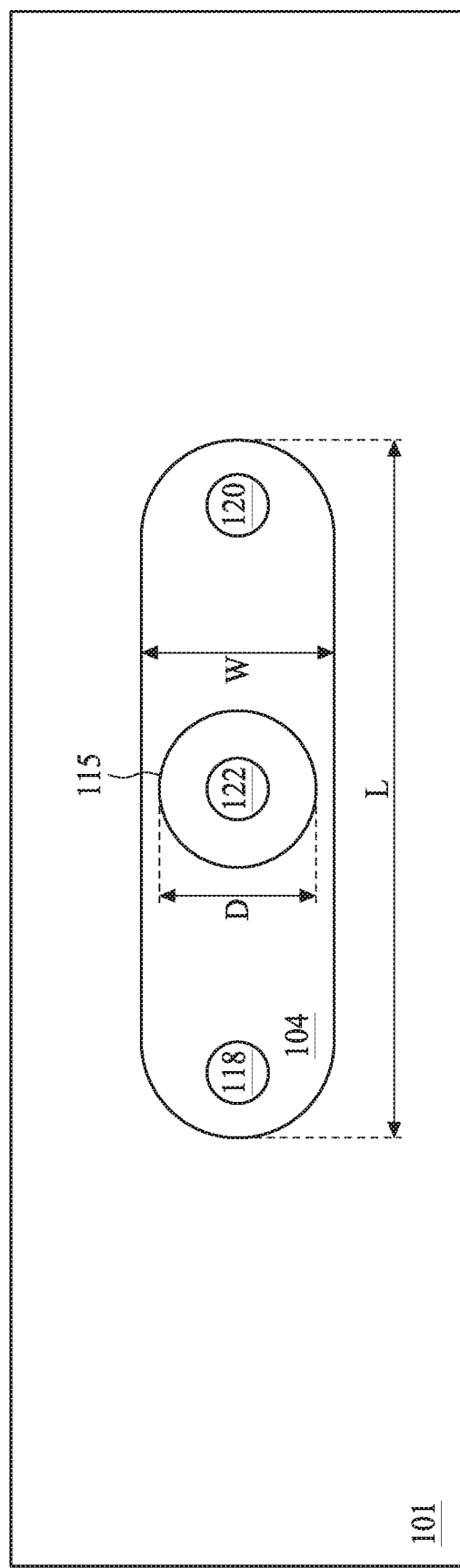
FIG. 3 is a top view illustrating the semiconductor structure in accordance with various embodiments of the present disclosure.

Notable, the type of domain wall showing in the magnetic layer 104 is highly correlated to a dimension thereof. The Bloch wall preferably occurs in films with a width of about 40 nm to about 200 nm and a thickness of about 10 nm to about 40 nm. In light of the above, a width W of the magnetic layer 104 may be in a range from about 40 nm to about 200 nm; and a thickness of the magnetic layer 104 may be in a range from about 10 nm to about 40 nm. In many instances, the magnetic layer 104 may be configured to possess a length L about 3 to 5 times the width W so that such shape anisotropy would lead to a magnetization direction of the magnetic layer 104 along a major dimension, in this instance, the length L, of the magnetic layer 104. In many instances, the diameter D of the MTJ cell 115 may be substantially 0.6 to 0.9 time the width W of the magnetic layer 104. In many instances, the magnetic layer 104 of FIG. 2 may be replaced by other profile that is substantially smooth and without the presence of the four corners. For example, FIG. 3 is a top view illustrating the semiconductor structure 100 in accordance with various embodiments of the present disclosure. The magnetic layer 104 of FIG. 3 is elliptical-shaped that is more efficient for the injection current flow without the obstruction of the four corners.

Figure 4:
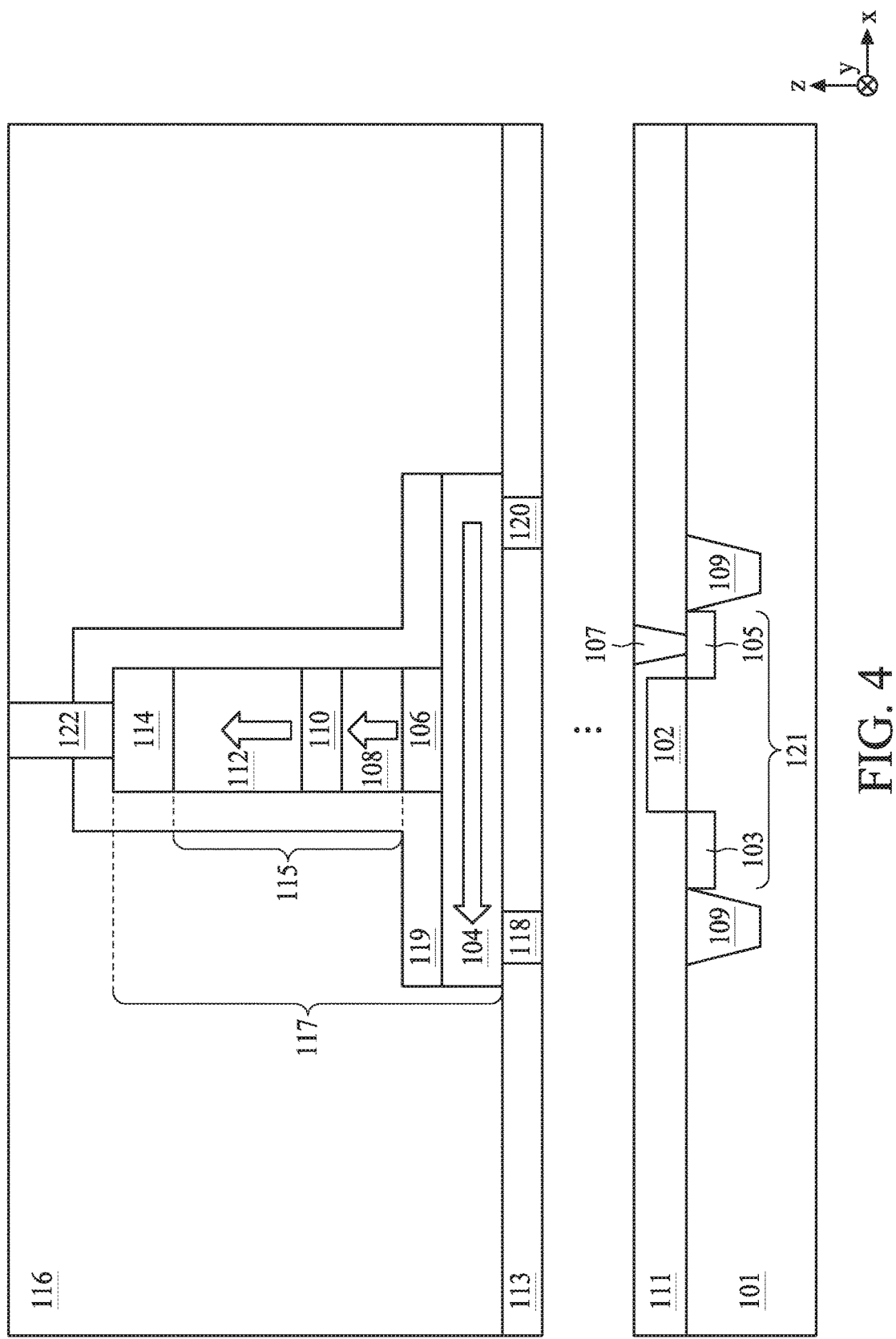
FIG. 4 to FIG. 7 depict switching operations with respect to the free layer by using the Bloch wall in accordance with various embodiments of the present disclosure.
Figure 5:
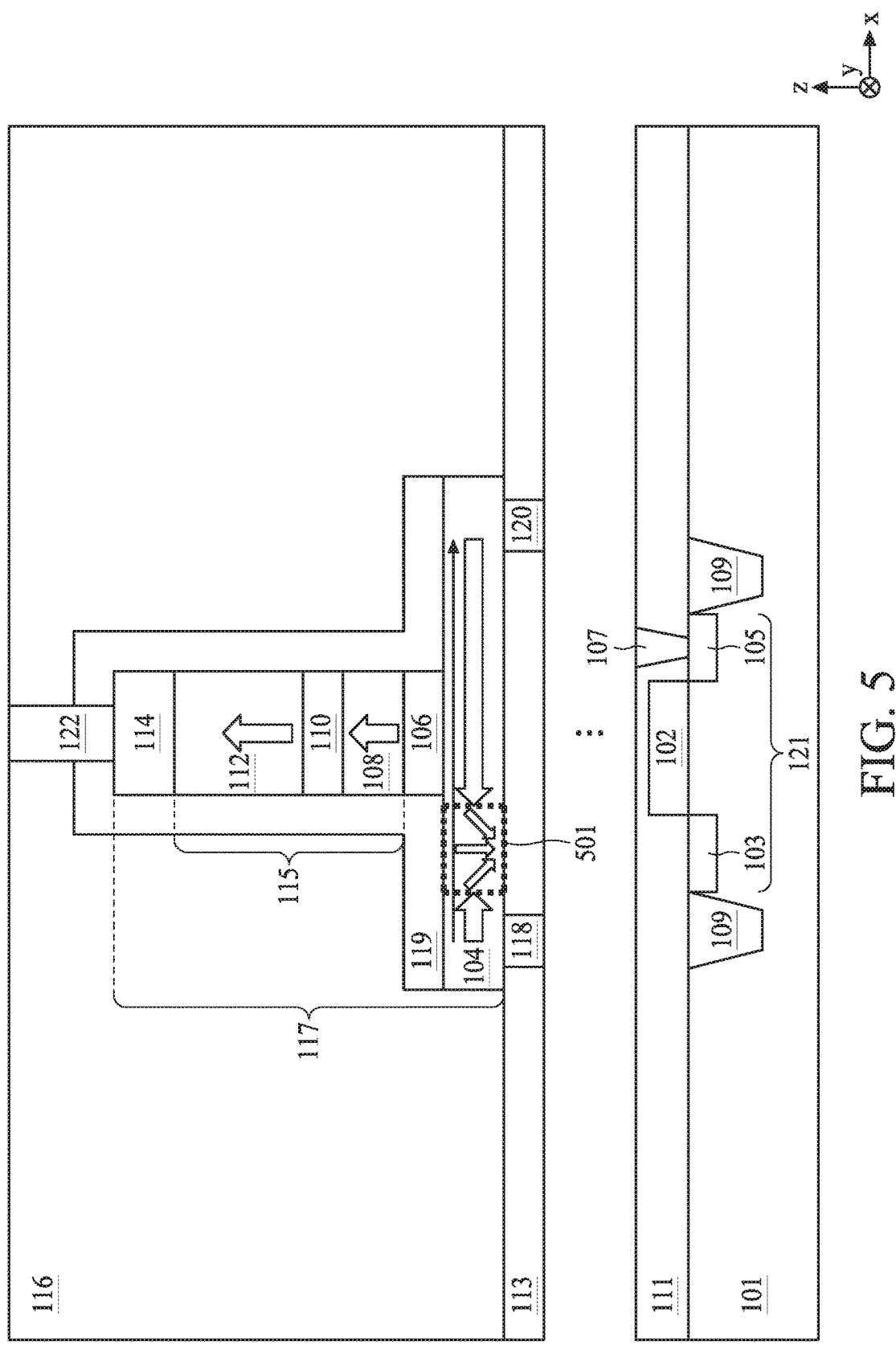

FIG. 4 to FIG. 7 depict switching operations with respect to the free layer 108 by using the Bloch wall in accordance with various embodiments of the present disclosure. In FIG. 4, the MTJ cell 115 starts at a condition that a first type logical value, e.g., logical value "0" is stored therein. In that case, the magnetization of the free layer 108 and the reference layer 112 are parallel and the magnetic moments have the same polarity. The magnetic layer 104 has a magnetic polarization that is in-plane, and depicted in the illustration as being from a first terminal to a second terminal opposite to the first terminal, for instance, but not limited to, from a right terminal to a left terminal. When the MTJ cell 115 is required to be rewritten by a second type logical value, e.g., logical value "1", all that needs to be done is an opposite configuration of the magnetization in the free layer 108. In order to achieve the switching of the free layer 108, a current is injected from the second terminal to the first terminal, for instance, but not limited to, from the left metal line 118 passed directly through the magnetic layer 104 to the right metal line 120.

Figure 6:
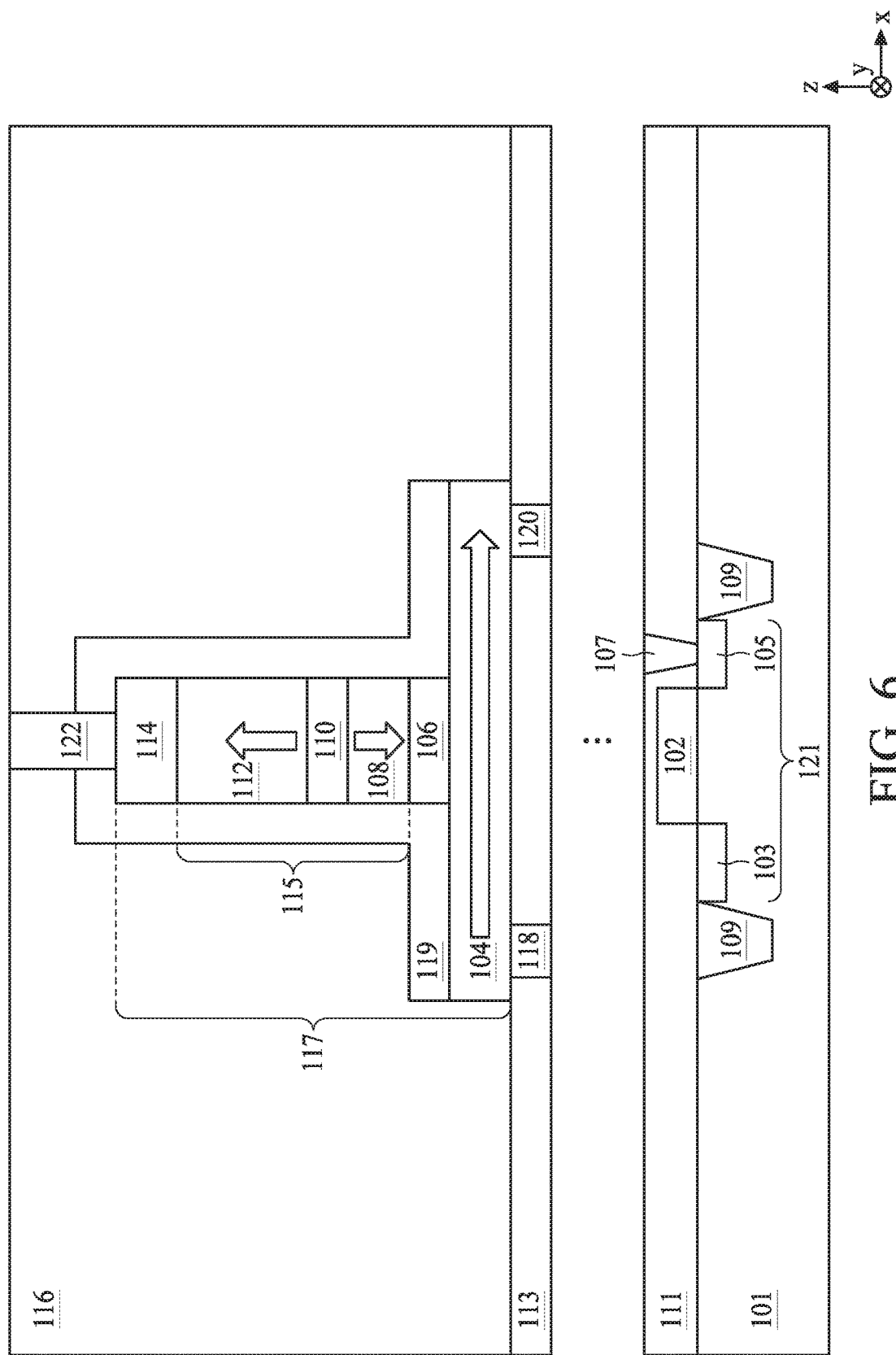
Figure 7:
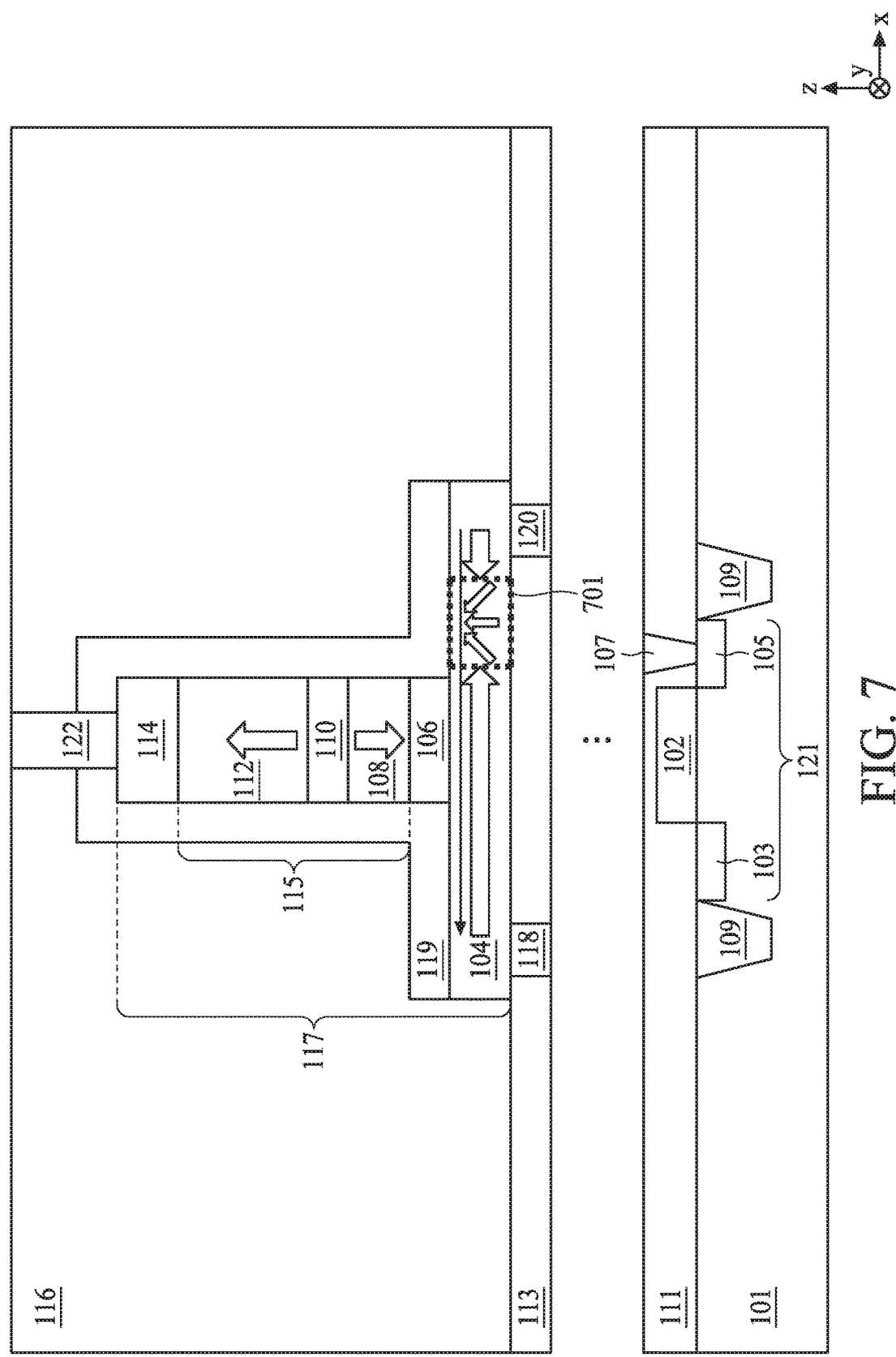

When the current is injected from the left metal line 118 to the right metal line 120, a magnetic polarization from left to right gradually forms and a Bloch wall 501 appears at an interface between the two opposite magnetic moments. After being generated at a left side of the magnetic layer 104, the Bloch wall 501 moves across the magnetic layer 104 to a right side of the magnetic layer 104. As can be seen from FIG. 5, in the region of Bloch wall 501 shows a flipping process of the magnetic polarization. The region of Bloch wall 501 includes a –z direction magnetic field component, i.e. a magnetic field having a direction opposite to the free layer 108, to effect the magnetic polarization of the free layer 108. As mentioned above, a part of the current passing through the magnetic layer 104 may be spin polarized by the magnetic field of the Bloch wall 501 and therefore passing through the free layer 108 in a direction antiparallel to the reference layer 112, to apply a torque to the free layer 108 to assist switching the direction of the magnetization of the free layer 108. At the end of the writing process, the magnetic moments in the magnetic layer 104 have the same polarity, i.e. the +x direction, as shown in FIG. 6.

The magnetic moment in the free layer 108 is antiparallel to the reference layer 112, which indicates a logical value "1" is stored. On the other hand, when the MTJ cell 115 is required to be rewritten by a logical value "0", a current is injected from the right metal line 120 passed directly through the magnetic layer 104 to the left metal line 118.

When the current is injected from the right metal line 120 to the left metal line 118, a magnetic polarization from right to left gradually forms and a Bloch wall 701 appears at an interface between the two opposite magnetic moments. After being generated at a right side of the magnetic layer 104, the Bloch wall 701 moves across the magnetic layer 104 to a left side of the magnetic layer 104. As can be seen from FIG. 7, in the region of Bloch wall 701 shows a flipping process of the magnetic polarization. The magnetization the region of Bloch wall 701 includes a +z direction field component, i.e. a field having a direction opposite to the free layer 108, to effect the magnetic polarization of the free layer 108. As mentioned above, a part of the current passing through the magnetic layer 104 may be spin polarized by the field of the Bloch wall 701 and therefore passing through the free layer 108 in a direction parallel to the reference layer 112, to apply a torque to the free layer 108 to assist switching the direction of the magnetization of the free layer 108. At the end of the writing process, the magnetic moments in the magnetic layer 104 have the same polarity, i.e. the –x direction, as shown in FIG. 4.

FIG. 8 to FIG. 12 are cross-sectional views of a semiconductor device fabricated at various stages in accordance with various embodiments of the present disclosure. In FIG. 8, the semiconductor substrate 101 is provided with the transistor structure 121 prepared in the front-end-of-line operation and covered by the ILD 111. Metallization layers are prepared in the back-end-of-line (BEOL) operation over the semiconductor substrate 101. Between the $N^{th}$ metal layer and the $(N+1)^{th}$ metal layer, layers associated with the MTJ device 117 are formed, where N is an integer greater than or equal to 1. From bottom to top, the layers associated with the MTJ device 117 in sequence include the magnetic layer 104, the spacer 106, the free layer 108, the barrier layer 110, the reference layer 112 and the top electrode 114 each formed by any process known in the art, such as by an atomic layer deposition (ALD) operation or a physical vapor deposition (PVD).

Figure 9:
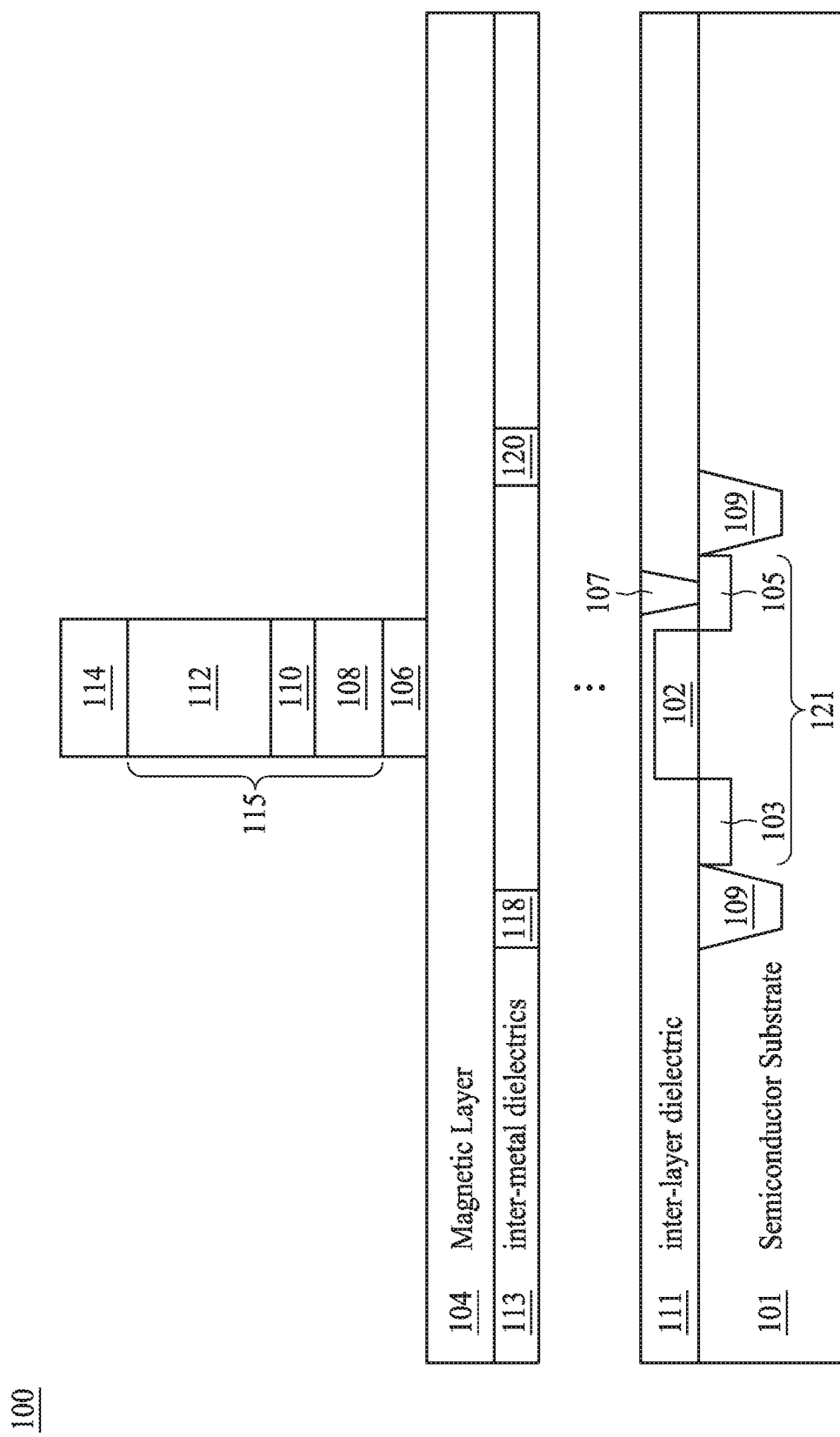

In FIG. 9, a mask layer (not shown) is formed over the top electrode 114 in order to pattern the spacer 106, the free layer 108, the barrier layer 110, the reference layer 112 and the top electrode 114 into an cylinder structure by a reactive ion etch (RIE). In many instances, the patterned layers 106, 108, 110, 112 and 114 may have an elongated rectangular or a trapezoidal shape viewing from a cross section.

Figure 10:
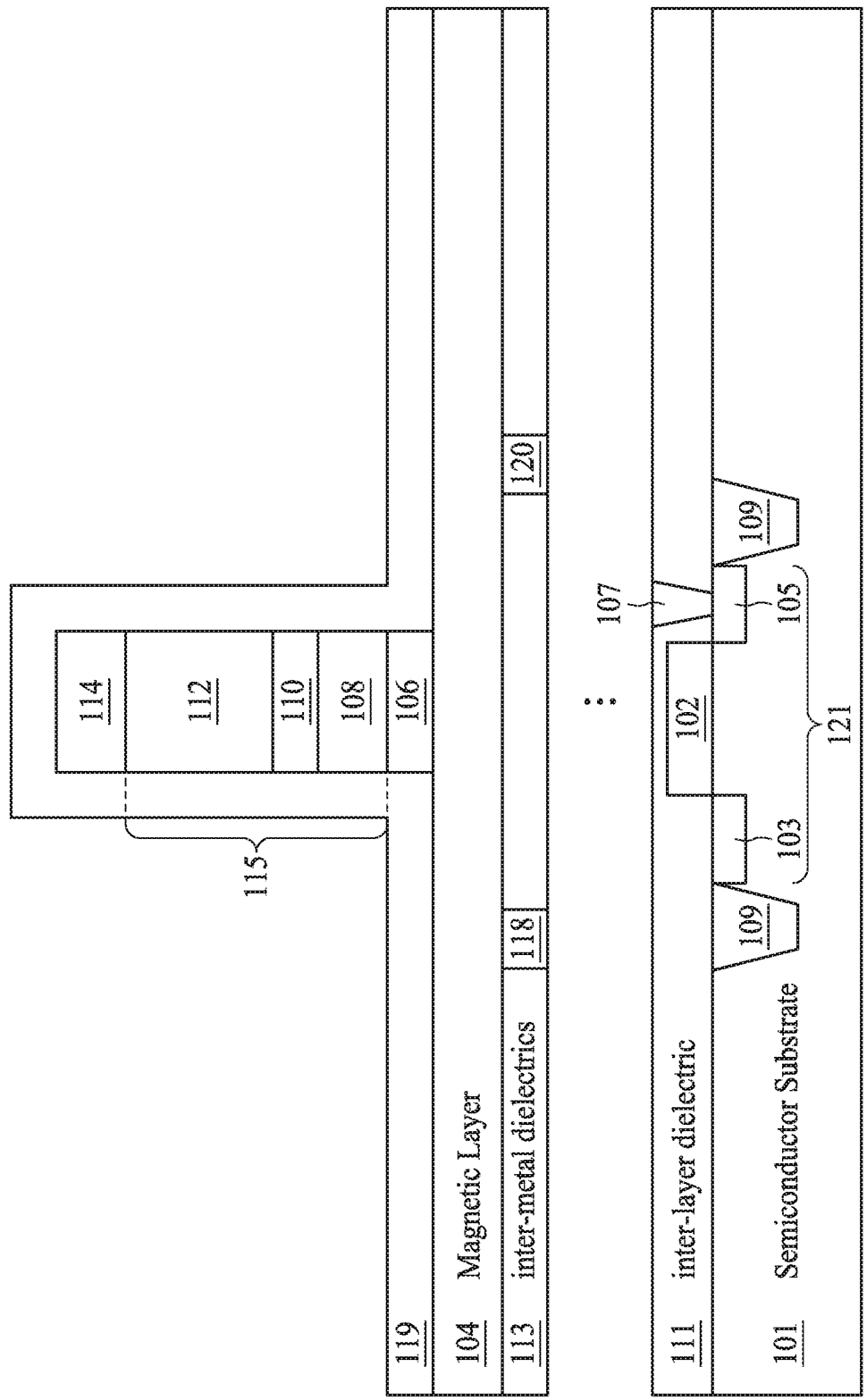
Figure 11:
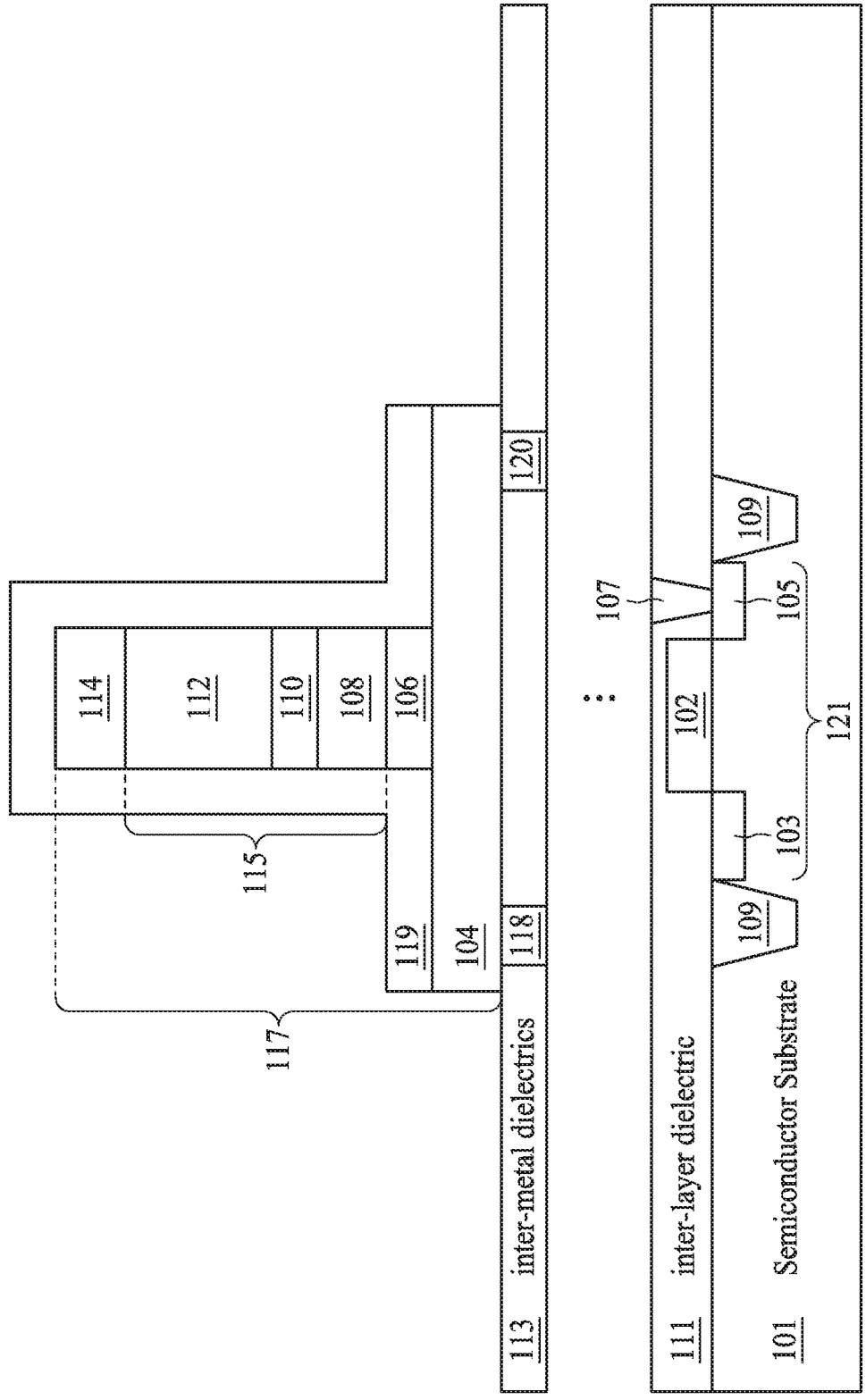
Figure 12:
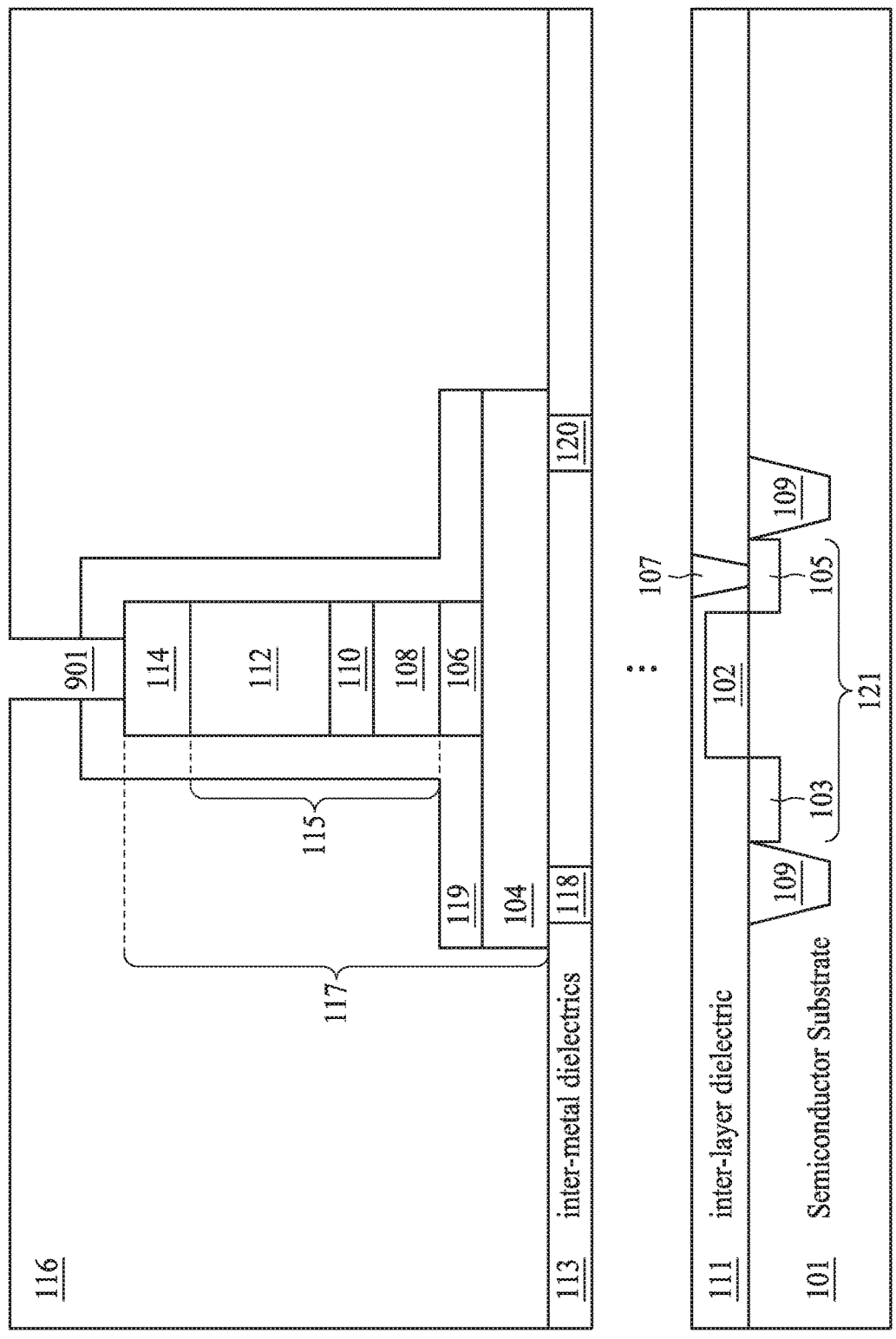

In FIG. 10, the protection or barrier layer 119 may be conformally formed over the magnetic layer 104 and the patterned layers 106, 108, 110, 112 and 114. Then, as shown in FIG. 11, a portion of the protection or barrier layer 119 and the magnetic layer 104 are patterned to expose the underneath IMD 113. In FIG. 12, a dielectric layer 116 is deposited over the semiconductor substrate 101. In many instances, a thickness of the dielectric layer 116 may be configured to be greater than a height of the MTJ device 117. In that way, a top surface of the dielectric layer 116 is higher than a top surface of the top electrode 114. Then the dielectric layer 116 and the protection or barrier layer 119 are patterned to form a trench 901 to expose the top surface of the top electrode 114.

Finally, a conductive metal fills the trench 901 through, for example, an existing dual Damascene operation, and excess portions of the conductive material are removed from the surface using a chemical mechanical polishing (CMP) operation, an etch operation, or combinations thereof, as shown in FIG. 1.

Some embodiments of the present disclosure provide a semiconductor structure for storing a data. The semiconductor structure includes: a first terminal, a second terminal and a third terminal, wherein the data is written into the semiconductor structure through the first terminal and the second terminal, and the data is read out from the semiconductor structure through the second terminal and the third terminal; a substrate; a magnetic layer over the substrate, a first end of the magnetic layer being in physical contact with the first terminal, and a second end opposite to the first end of the magnetic layer being in physical contact with the second terminal; a magnetic tunnel junction (MTJ) cell over the magnetic layer, wherein the first end and the second end of the magnetic layer laterally protrude from sidewalls of the MTJ cell, and the MTJ cell is between the first end and the second end of the magnetic layer, and the MTJ cell includes: a free layer; a barrier layer over the free layer; and a reference layer over the barrier layer; a non-magnetic conductive layer between the magnetic layer and the MTJ cell; and a top electrode over the MTJ cell, the top electrode being in physical contact with the third terminal.

Some embodiments of the present disclosure provide a method of writing a magnetic tunnel junction (MTJ) cell. The method includes: providing a magnetic layer neighboring to the MTJ cell, the magnetic layer having a first direction of magnetization; providing a non-magnetic conductive layer between the MTJ cell and the magnetic layer; and flipping a direction of magnetization of the magnetic layer from the first direction to a second direction opposite to the first direction.

Some embodiments of the present disclosure provide a method of fabricating a semiconductor structure. The method includes: providing a semiconductor substrate; depositing a magnetic layer over the semiconductor substrate; depositing a non-magnetic conductive layer over the magnetic layer; depositing a free layer over the non-magnetic conductive layer; depositing a barrier layer over the free layer; depositing a reference layer over the barrier layer; depositing a top electrode over the free layer; patterning the non-magnetic conductive layer, the free layer, the reference layer and the top electrode; and removing a portion of the magnetic layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure for storing a data, the semiconductor structure comprising:
    a first terminal, a second terminal and a third terminal, wherein the data is written into the semiconductor structure through the first terminal and the second terminal, and the data is read out from the semiconductor structure through the second terminal and the third terminal;
    a substrate;
    a magnetic layer over the substrate, a first end of the magnetic layer being coupled to the first terminal, and a second end opposite to the first end of the magnetic layer being coupled to the second terminal;
    a magnetic tunnel junction (MTJ) cell over the magnetic layer, wherein the first end and the second end of the magnetic layer laterally protrude from sidewalls of the MTJ cell, and the MTJ cell is between the first end and the second end of the magnetic layer, and the MTJ cell includes:
        a free layer;
        a barrier layer over the free layer; and
        a reference layer over the barrier layer; and
    a top electrode over the MTJ cell, the top electrode being in direct contact with the third terminal.

2. The semiconductor structure of claim 1, wherein from a top view, the magnetic layer is elongated-shaped and the MTJ cell is circular-shaped.

3. The semiconductor structure of claim 1, wherein magnetic layer includes ferromagnetic materials.

4. The semiconductor structure of claim 1, wherein a dimension of the magnetic layer permits a Bloch wall formation when a current passed through the magnetic layer along a major dimension of the magnetic layer.

5. The semiconductor structure of claim 4, wherein a thickness of the magnetic layer is about 10 nm to about 40 nm, and a width of the magnetic layer is about 40 nm to about 200 nm.

6. The semiconductor structure of claim 2, wherein the magnetic layer is elliptical-shaped from the top view.

7. The semiconductor structure of claim 1, wherein magnetic anisotropy of the MTJ cell has an out-of-plane direction.

8. The semiconductor structure of claim 1, further comprising a non-magnetic conductive layer between the magnetic layer and the MTJ cell, wherein a thickness of the non-magnetic conductive layer is no greater than a spin diffusion length of the non-magnetic conductive layer.

9. A method of writing a magnetic tunnel junction (MTJ) cell, the method comprising:
    providing a magnetic layer neighboring to the MTJ cell, the magnetic layer having a first direction of magnetization; and
    flipping a direction of magnetization of the magnetic layer from the first direction to a second direction opposite to the first direction.

10. The method of claim 9, wherein:
    the first direction and the second direction are in a horizontal direction; and
    the MTJ cell includes a free layer, and a magnetization direction of the free layer is free to rotate and representative of a logical value stored in the MTJ cell, and a direction of magnetization of the free layer of the MTJ cell is perpendicular to the first direction and the second direction.

11. The method of claim 9, wherein providing the magnetic layer comprises:
    providing the magnetic layer with a thickness of about 10 nm to about 40 nm, and a width of about 40 nm to about 200 nm.

12. The method of claim 9, further comprising:
    providing a non-magnetic conductive layer with a thickness no greater than a spin diffusion length of the non-magnetic conductive layer.

13. The method of claim 10, wherein the flipping the magnetization of the magnetic layer from the first direction to the second direction opposite to the first direction comprises:
    generating a Bloch wall at a first end of the magnetic layer.

14. The method of claim 13, wherein the generating the Bloch wall at the first end of the magnetic layer comprises:
    gradually changing the direction of magnetization of the magnetic layer at the first end from the first direction to the second direction.

15. The method of claim 14, wherein the gradually changing the direction of magnetization of the magnetic layer at the first end from the first direction to the second direction comprises:

injecting a current from the first end of the magnetic layer passing through the magnetic layer to the second end.

16. The method of claim 14, wherein the Bloch wall includes a magnetic moment perpendicular to the first direction and the second direction.

17. The method of claim 16, wherein the flipping the magnetization of the magnetic layer from the first direction to the second direction opposite to the first direction further comprises:
   moving the Bloch wall from the first end to across the magnetic layer to a second end of the magnetic layer opposite to the first end, wherein the MTJ cell is between the first end and the second end.

18. The method of claim 17, wherein the flipping the magnetization of the magnetic layer from the first direction to the second direction opposite to the first direction further comprises:
   affecting the direction of the magnetization of the free layer of the MTJ cell by the magnetic moment of the Bloch wall perpendicular to the first direction and the second direction.

19. A method of fabricating a semiconductor structure, comprising:
   providing a semiconductor substrate;
   depositing a magnetic layer over the semiconductor substrate;
   depositing a free layer over the magnetic layer;
   depositing a barrier layer over the free layer;
   depositing a reference layer over the barrier layer;
   depositing a top electrode over the free layer;
   patterning the free layer, the reference layer and the top electrode; and
   removing a portion of the magnetic layer.

20. The method of claim 19, further comprising:
   depositing a metallization layer over the semiconductor substrate, the metallization layer having a first terminal and a second terminal;
   depositing a protection layer to cover exposed portions of the patterned free layer, the patterned barrier layer, the patterned reference layer, the patterned top electrode, and the magnetic layer;
   removing a portion of the protection layer to expose a portion of the patterned top electrode; and
   forming a third terminal in physical contact with the patterned top electrode;
   wherein
   the deposition of the magnetic layer over the semiconductor substrate comprises:
   depositing the magnetic layer over the semiconductor substrate to allow the magnetic layer in physical contact with the first terminal and the second terminal.

* * * * *